United States Patent [19]

Midgley

[11] 4,138,653
[45] Feb. 6, 1979

[54] SOLID STATE TUNER CONTROL

[75] Inventor: Edward L. Midgley, Carol Stream, Ill.

[73] Assignee: Stamcomp, Inc., Elk Grove Village, Ill.

[21] Appl. No.: 285,229

[22] Filed: Aug. 31, 1972

Related U.S. Application Data

[60] Division of Ser. No. 133,265, Apr. 12, 1971, which is a continuation-in-part of Ser. No. 839,163, Jul. 7, 1969, Pat. No. 3,601,703.

[51] Int. Cl.² .................. H03H 5/12; H03J 3/06; H03J 5/04
[52] U.S. Cl. ..................... 334/15; 325/452; 325/458; 325/464; 334/51
[58] Field of Search .................. 334/14, 15, 16, 40, 334/51; 338/134, 191; 325/452, 453, 457, 458, 459, 461, 464, 465

[56] References Cited

U.S. PATENT DOCUMENTS

| 2,978,651 | 4/1961 | Canada | 334/51 |
| 3,110,004 | 11/1963 | Pope | 334/40 |
| 3,167,730 | 1/1965 | Anderson et al. | 334/15 |
| 3,391,347 | 7/1968 | Bosse et al. | 334/15 |

Primary Examiner—Saxfield Chatmon, Jr.
Attorney, Agent, or Firm—Pope, Ballard, Shepard & Fowle

[57] ABSTRACT

A television tuner arrangement is disclosed including a wide band signal selecting circuit having a solid state voltage variable capacitance selectively controllable in accordance with the level of applied voltage and a channel selector control for controlling the voltage levels applied thereto. The control illustrated herein includes a selector, actuatable to a plurality of channel selection settings, a cylindrically shaped structure providing an external surface of conductive material, and a plurality of voltage taps radially disposed about the surface of the cylindrical structural and mounted for individual movement along the conductive material. A tuning voltage bus is connected to the wide band circuit and is selectively connectable to each of the taps. The cylindrically shaped structure and the taps are mounted for rotation about the axis of the structure and ganged to the selector so that a separate tap is connected to the bus for each channel selection setting.

3 Claims, 19 Drawing Figures

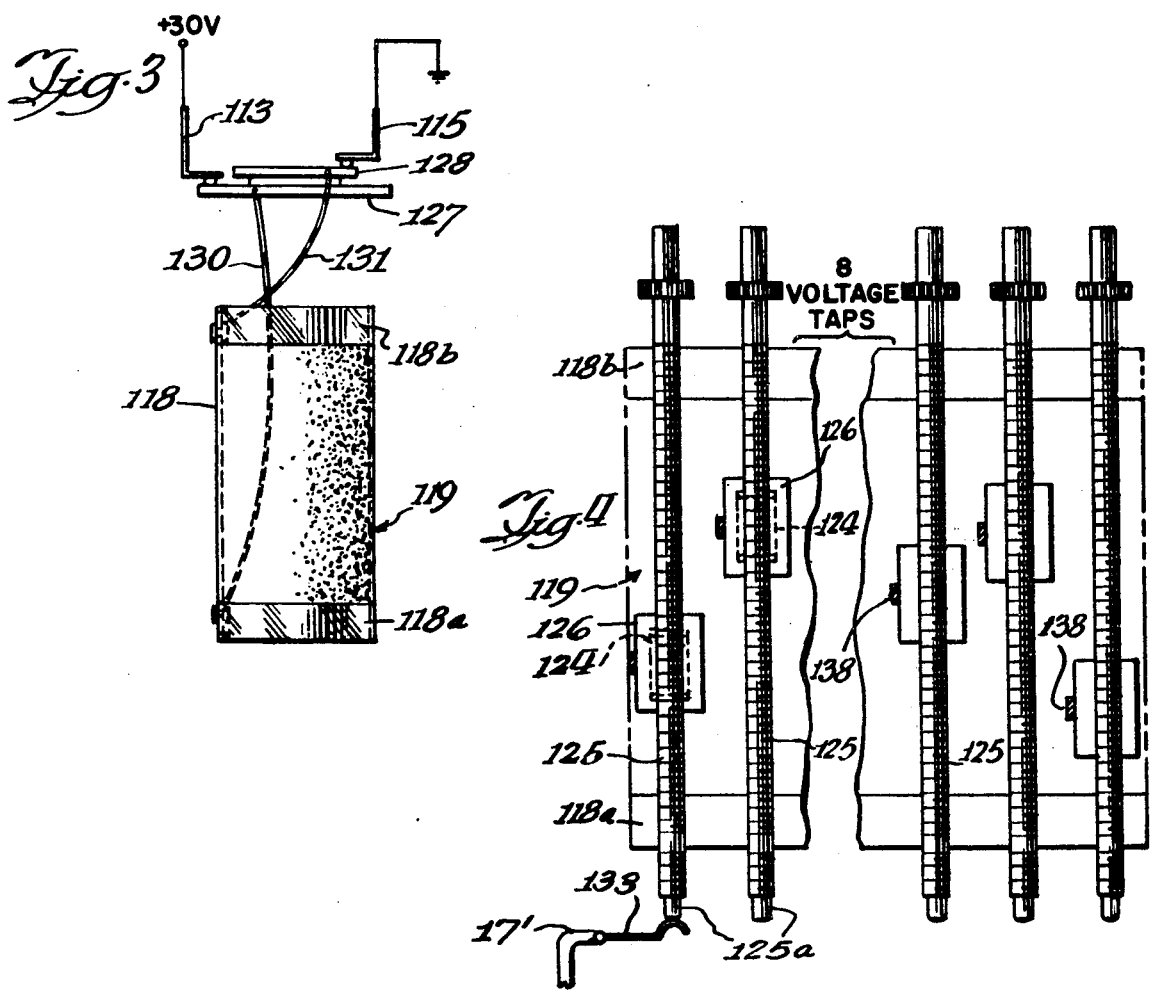
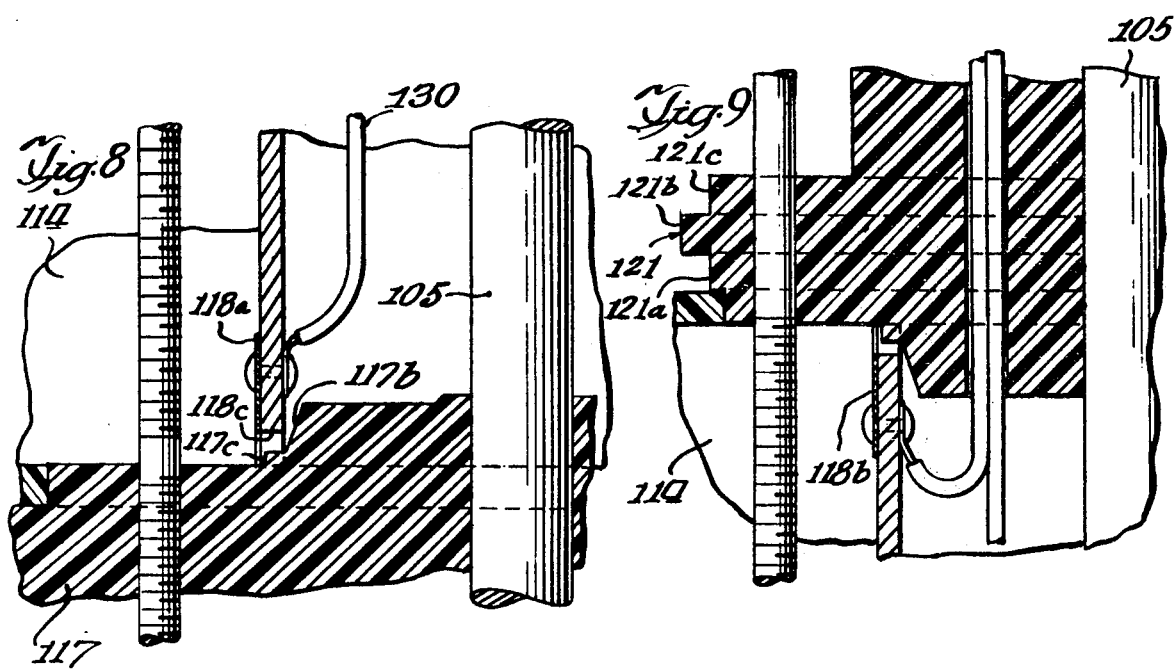

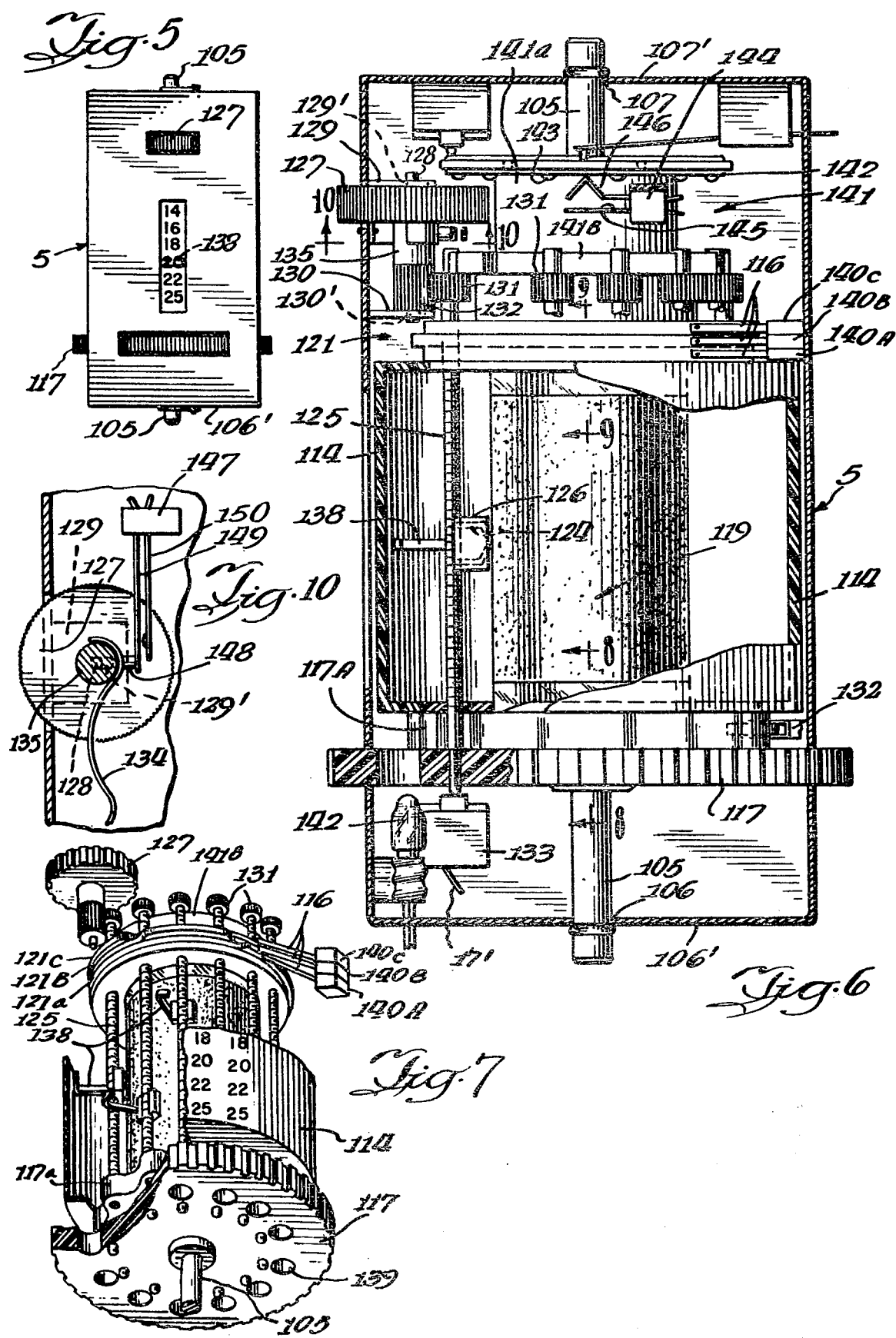

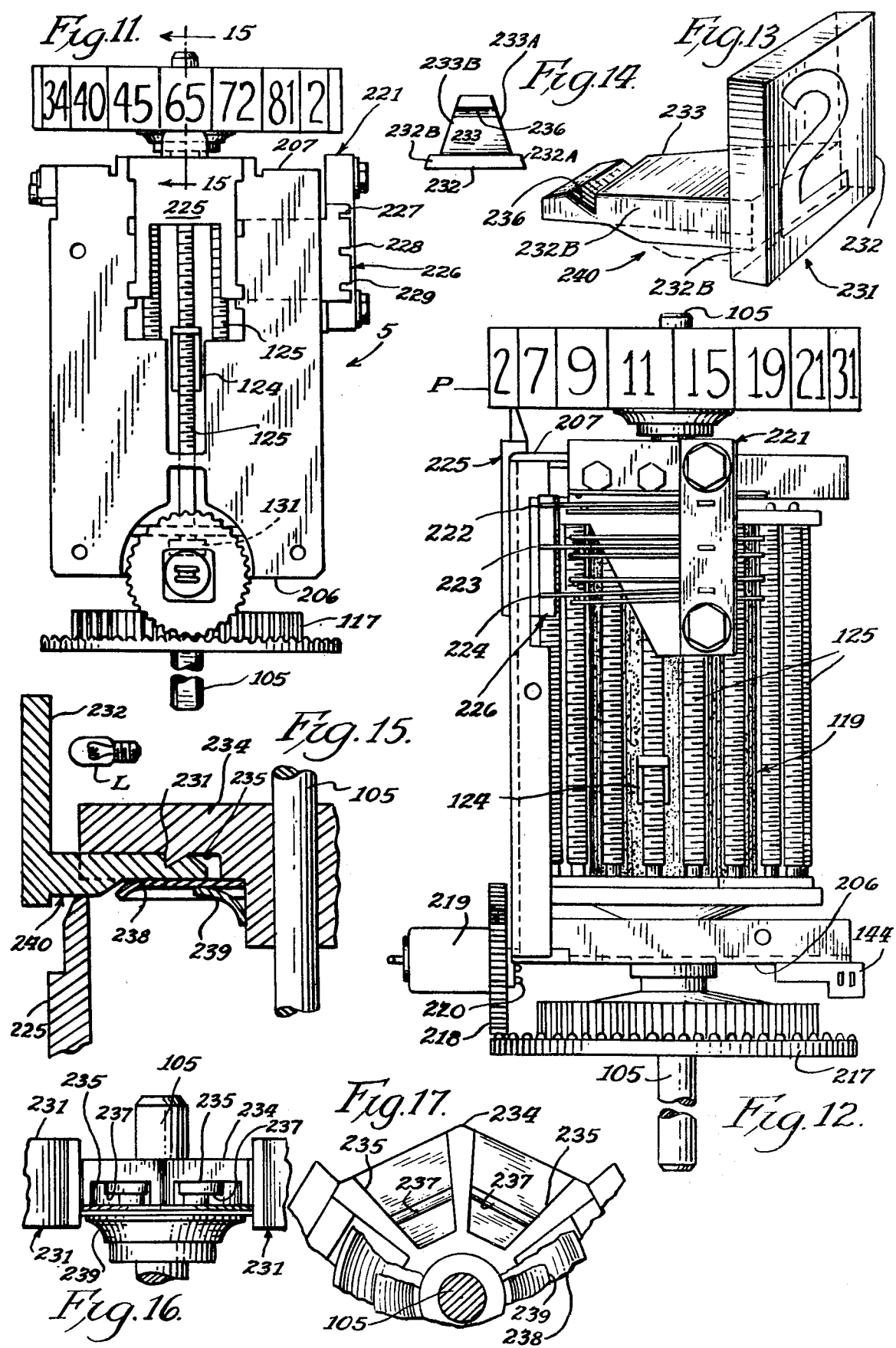

SOLID STATE TUNER CONTROL

This is a division of co-pending application Ser. No. 133,265, filed Apr. 12, 1971, which, in turn, is a continuation-in-part of application Ser. No. 839,163, filed July 7, 1969, now U.S. Pat. No. 3,601,703.

BACKGROUND OF THE INVENTION

In the United States, the government has allocated three ranges or bands in the electromagnetic radio spectrum for television broadcast and reception. These are from 54 to 88 megahertz (MHz), from 174 to 216 MHz, and from 470 to 890 MHz. These ranges or bands are further divided into individual channels, each being 6 MHz wide. There are thus five channels in the first band, seven in the second, and seventy in the third band. By convention also, the lowest frequency channel, that is from 54 to 60 MHz, is designated channel 2 while each progressively higher channel frequency is designated by the next highest number. Thus, channels 2-6 are in the first band, channels 7-13 in the second band and channels 14-83 in the third band.

The lower two bands (channels 2-13), despite the gap between them, are conventionally referred to as a single band, namely, the Very High Frequency or VHF band. The other band (channels 14-83) is referred to as the Ultra High Frequency or UHF band.

Because of the great disparity between the VHF and UHF frequency ranges, it is the normal practice to employ two separate tuners in a television set designed to receive the VHF and UHF bands. Recently, solid-state tuners have been developed which tune to desired frequencies or channels in response to the application of voltages of various levels. Examples of such tuners are disclosed in Wittig U.S. Pat. No. 3,354,397 and Manicki U.S. Pat. No. 3,643,168.

The requirement imposed by the government that each television set sold in the United States be capable of tuning to all possible channels has presented difficulties with regard to the construction of inexpensive, durable and compact controls for use with the solid-state tuner circuitry. Adding to the difficulties encountered are factors which include the desirability of providing a single tuner control having the capability of selecting both VHF and UHF channels, of providing a control affording preset fine tuning, and providing a control presenting the rotary detent type of channel selection which television viewers are accustomed to.

SUMMARY OF THE INVENTION

A channel selector control comprises, in accordance with the present invention, a selector actuatable to a plurality of channel selection settings to individually select each of a corresponding number of channels, a tuning voltage bus connected to determine the applied voltage at a wide band signal selecting circuit having resonant circuit means including a solid state voltage variable capacitance selectively controllable in accordance with the level of applied voltage, variable voltage facility comprising a single strip of resistive material having two opposite spaced-apart end regions, facility for maintaining a uniform first level of voltage at one of the regions and a uniform second level of voltage at the other of the regions to provide a voltage gradient between the regions, a plurality of voltage taps, one for each channel selection setting, facility for adjustably mounting the taps for individual movement along the strip in the direction of the voltage gradient, and facility responsive to the actuation of the selector for selectively connecting each of the taps individually to the bus whereby a predetermined distinctive level of voltage is applied to the output bus for each channel selection setting.

A more specific aspect of the present invention relates to the construction of the variable voltage facility wherein a separate voltage divider is provided for each channel selection setting, each including a voltage tap, mounting of the voltage dividers in side-by-side extending relation to define an annular array, and provision of structure operating in ganged relation to the selector for rotating the array to a corresponding number of positions for selectively connecting the tuning voltage bus with the particular tap corresponding to the selected channel setting whereby a predetermined distinctive level of voltage is applied to the bus for each channel selection setting.

Another aspect of the present invention relates to the utilization of a cylindrically shaped structure having an external uniform coating of resistive material thereon, and mounting the voltage taps to lead screws which are radially disposed about the exterior of the cylindrically shaped structure, each lead screw being individually rotatable to provide linear movement of a corresponding tap along the resistive material.

Other features and advantages of the invention will be apparent from the following description and claims and are illustrated in the accompanying drawings which show structure embodying preferred features of the present invention and the principles thereof, and what is now considered to be the best mode in which to apply these principles.

BRIEF DESCRIPTION OF THE DRAWINGS

In the accompanying drawings forming a part of the specification, and in which like numerals are employed to designate like parts throughout the same:

FIG. 3 is a fragmentary elevational view showing the resistive drum and illustrating the manner of providing an axial voltage gradient thereacross;

FIG. 4 is a partial fragmentary view showing a development of the resistive drum of FIG. 4 and showing a number of the lead screws and voltage taps;

FIG. 5 is a front elevational view a structural embodiment of the tuner control of FIG. 2 and shows the selector thumbwheel, fine tuning dial, and channel readout;

FIG. 6 is a side elevational view of the tuner control of FIG. 3 with the housing wall cut away to reveal the interior;

FIG. 7 is a partial perspective view of the tuner control embodiment of FIG. 3;

FIG. 8 is a sectional view taken as indicated on the line 8—8 of FIG. 6;

FIG. 9 is a sectional view taken as indicated on the line 9—9 of FIG. 6; [and]

FIG. 10 is a sectional view taken as indicated on the line 10—10 of FIG. 6;

FIG. 11 is a front elevational view of a modified embodiment of the tuner control;

FIG. 12 is a side elevational view of the control of FIG. 11;

FIG. 13 is an enlarged perspective view of a channel setting tab for the control of FIGS. 11 and 12;

FIG. 14 is a top plan view of a tab;

FIG. 15 is a sectional view taken, as indicated, along the line 15—15 of FIG. 11;

FIGS. 16 and 17 are fragmentary view of the tab array and mounting disk;

DETAILED DESCRIPTION

For purposes of illustrative disclosure the channel selector control of the present invention will be described in the television tuner arrangement of FIG. 1 wherein there is shown a VHF tuner 10 and a UHF tuner 15 which, as indicated previously, are voltage responsive types of solid state circuits. In the VHF tuner 10, the channels are arranged in a low frequency band (channels 2-6) and a high frequency band (channels 7-13). The VHF tuner incorporates a resonant circuit having parallel inductances arranged so that a permanent inductance is operative to determine the low frequency band. A shunt high frequency inductance is switched into operation to act in conjunction with the permanent inductance in determining the high frequency band. Alternatively, and as shown in FIGS. 5 through 7 of Wittig Pat. No. 3,354,397 the VHF tuner can incorporate for band switching purposes series connected inductances, both of which are operative to determine the low frequency band. In such case one of such series connected inductances is switched out of operation by means of the application of forward bias to a diode connected in parallel therewith to determine the high frequency band. In the UHF tuner 15, the channels are arranged in an ultra high frequency band (channels 14-83).

Figure 1:
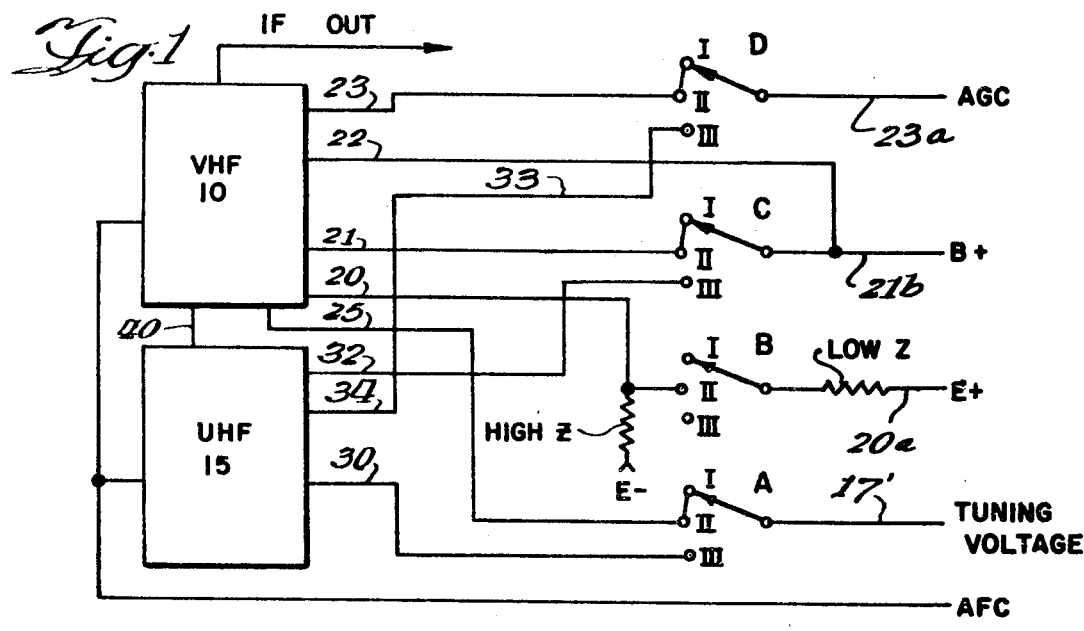
FIG. 1 is a schematic and functional diagram showing the general arrangement of and circuitry for controlling the modes of solid state voltage responsive types of VHF and UHF tuners.

As described in the copending applications referred to above, the tuners 10, 15 have three modes of operation which conveniently can be described with reference to four schematic switche A,B,C and D as follows:

1. A low band VHF mode which is selected when the switch blades are at position I;

2. A high-band VHF mode which is determined when the switch blades are at position II;

3. A UHF mode which is selected when the switch blades are at position III;

As described in the above referenced applications, tuning in the low-band of the UHF tuners is controlled solely by the applied voltage on line 25 in FIG. 1, but tuning in the high-band is controlled both by the applied voltage in line 25 and by the switch B, which is operable to direct voltage of either polarity to line 20 to provide for band switching. For high-band operation the switch B is closed to position II, thereby connecting line 20 to the positive voltage bus 20A whereby the shunt inductance of the VHF tuner is in circuit. For low-band operation the switch B is closed to the position I to allow a reverse voltage from bus 20B to feed line 20 and thereby block out the circuit connection to the shunt inductance.

The VHF tuner circuitry in FIG. 1 further includes a conventional AGC supply line 23 which is connectable to an AGC supply bus 23A through switch D. A B+ power supply bus 21B is linked to a mixer B+ line 22 and is connectable by switch C to an OSC and RF B+ line 21.

The UHF tuner 15 includes a conventional AGC supply line 34 which is connectable to the AGC supply bus 23A through line 33 by switch D. The UHF tuner receives power through the B+ power supply line 32 which is connectable to the B+ power supply bus 21B by switch C.

The VHF tuner 10 receives tuning voltage through line 25 which is connectable by switch A to tuning voltage supply bus 17'. Switch A also serves to connect tuning voltage supply bus 17' to the UHF tuner 15 through voltage line 30.

Typically, the IF frequency output of the UHF tuner is amplified by using portions of the VHF IF frequency amplification circuitry. Accordingly, line 40 carries the UHF IF frequency signal to the IF amplifier portion of the VHF tuner circuit.

Figure 2:
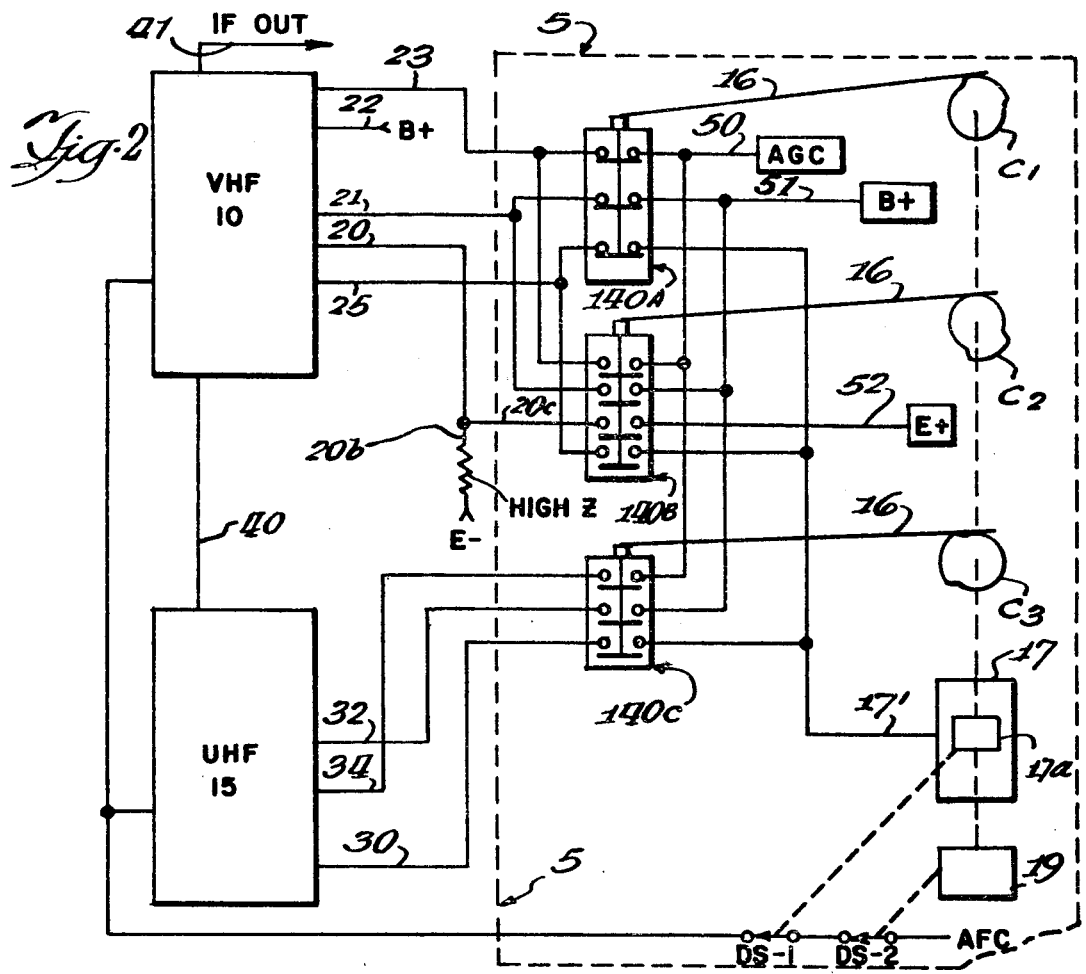
FIG. 2 is a schematic and functional diagram showing a tuner control for controlling the mode and individual channel tuning of solid state VHF and UHF tuners in accordance with the present invention.

Turning to FIG. 2, there is shown diagrammatically a tuner control 5 for controlling the mode of tuners 10, 15 as well as the voltage levels to be applied to the tuners for individual UHF and VHF channel selection.

As illustrated, the tuner control 5 includes a selector mechanism 19 which, as will be explained below, has a plurality of UHF and VHF channel selection settings. Variable voltage mean 17 is shown mechanically ganged (as indicated by the dotted line) to the selector 19 and is responsive to the actuation of the selector 19 from channel setting to channel setting to provide selective predetermined voltage levels to voltage bus 17'. Each tuning voltage level so provided corresponds to one of the channels and such voltage level will be produced each time the selector 19 is actuated to such setting.

In the tuner control disclosed herein, each of the voltage levels is independently controllable through actuation of the preset tuning mechanism 17A. As will be explained, the preset tuning mechanism 17A is operable to vary only the voltage level which is being provided to voltage bus 17'. Thus, once the voltage level corresponding to a channel setting has been tuned (when at the selected channel position), it will remain so until the viewer actuates the selector 19 to the same channel setting and again actuates the preset tuning mechanism 17A.

For controlling the mode of the tuners 10, 15 the tuner control 5 of FIG. 2 is shown to include three conventional 2-position, multi-pole switches, 140A, 140B and 140C. As will be apparent, these switches perform the switching functions of schematic switches A,B,C and D of FIG. 1 as described above. Such is accomplished by providing each of the switches with an input AGC line which is connected in parallel with the AGC supply bus 50. Similarly, each of the switches is provided with B+ and tuning voltage input lines which are respectively parallel connected with B+ supply bus 51 and tuning voltage line 17'. In addition, switch 140B has an E+ lead input 52 to provide for band switching in the VHF tuner 10.

As shown, the VHF tuner 10 has its AGC supply line 23 connected in parallel with switches 140A and 140B. Similarly, VHF tuner 10 receives B+ and tuning voltage along lines 21, 25 which are respectively connected in parallel with switches 140A and 140B. As stated above, the polarity of the voltage along VHF band switching voltage line 20 is shown to be controlled by switch 140B. Thus, switch 140A, when closed, determines the low-band VHF mode, while switch 140B, when closed, determines the high-band VHF mode.

The UHF mode is controlled through switch 140C, which, when closed, connects the tuning voltage line 30 to tuning voltage line 17' and which connects AGC and B+ lines 32, 32', 34 and 34' respectively to AGC supply line 50 and B+ supply line 51.

In order to control the opening and closing of the individual switches 140A, 140B and 140C, three corresponding cams C1, C2 and C3 are shown mechanically ganged to the variable voltage source 17 and selector 19. Each of the cams controls the opening and closing of one of the switches by means of a cam follower 16. As shown in FIG. 2 each of the cams has a raised cam lobe portion. When the cam follower of one of the switches 140A, 140B and 140C engages the cam lobe portion of its corresponding cam, such switch will be forced to its closed position. As indicated by the dotted line, the cams C1, C2 and C3 are mechanically ganged to each other and to the variable voltage source 17 and selector 19 so that, when the selector 19 is actuated to a particular channel, only that switch which controls the mode of tuners 10, 15 corresponding to the selected channel will be closed. Thus, for example, FIG. 2 shows the relationship of the switches and cams when one of the low-band VHF channels has been selected.

As will be appreciated by one skilled in the art, the tuners 10, 15 can optionally be provided with conventional AFC to prevent frequency drift in the oscillator stage. Because tuners 10, 15 are voltage responsive as stated above, it is important to cut-out or defeat the AFC when switching to a channel and when fine tuning a channel. As indicated by the dotted lines an AFC defeat switch DS-2 is ganged to the selector mechanism 19 so that the defeat switch is opened whenever the selector 19 is in a "between channel" position. The defeat switch DS-1 is shown mechanically ganged to the fine tuning mechanism 17A so that the switch is open during the fine tuning of the selected channel.

Turning to FIG. 5, the tuner control 5 is shown as it would normally be seen located at the front of a TV receiver cabinet. To select any desired UHF or VHF channel, the viewer need only rotate selector dial or thumbwheel 117. As will be explained in detail below, thumbwheel 117 is provided with a number of equally spaced detented channel selection settings so that the viewer can switch to any desired VHF or UHF channel through rotation of thumbwheel 117 from detent position to detent position. If it is necessary to fine tune the selected channel the viewer need only to press and rotate the fine tuning knob 127, as will be described below.

Referring to FIGS. 6 and 7, thumbwheel 117 is shown rigidly supported by shaft 105 which, in turn, is rotatably supported in suitable mounting slots 106, 107 located in opposite tuner control housing end walls 106', 107'. As best shown in FIGS. 7 and 8, thumbwheel 117 includes an annular detented flange portion 117A which, in cooperation with detent roller assembly 132, provides a plurality of detent positions, each of which corresponds to one of the channel selection settings.

In the tuner control embodiment disclosed herein, the variable voltage means 17 of FIG. 2 comprises a single strip of resistive material 118 having a pair of uniformly spaced apart opposite edge regions 118A, 118B FIG. 4). A uniform first level of voltage is maintained along the edge region 118A and a uniform second level of voltage is maintained along edge region 118B. The strip resistive material 118 shown herein is of substantially uniform resistivity and cross-section so that a bodily uniform voltage gradient is effected between the edge regions 118A, 118B. That is, the voltage level at point along any single line parallel to the edge regions will be substantially equal. It will be noted that the voltage levels maintained along the edge regions 118A, 118B are such as to define a voltage range sufficient to effect a full range of frequency tuning of tuners 10, 15.

In order to provide tuners 10, 15 with the voltage levels which are necessary to cause the tuners to tune to selective VHF and UHF channels, a plurality of lead screw structures 125, which comprise voltage bus bars, are mounted adjacent the strip 118. Each of the lead screws 125 adjustably mounts a contactor or voltage tap 124 consisting of a formed spring wire mounted in a carrier 126 and simultaneously biased against resistive element 118 and into root of thread on lead screw 125, for movement along the strip 118 in the direction of the voltage gradient. Each of the taps 124 is positioned axially along the strip 118 so as to transmit a predetermined level of voltage to its corresponding lead screw 126. Thus, the end portion 125a of each lead screw 125 carries a voltage which corresponds to a required voltage level necessary to cause the tuners 10, 15 to tune to a desired channel frequency. As will be explained in detail below, as the viewer selects a desired channel, the lead screw 125 carrying the voltage level corresponding to the selected channel will be brought into contact with wiper contact 133 and thence to the proper of tuners 10, 15.

In FIG. 3 the strip of conductive material 118 is shown as actually comprising a relatively thin outer coating of resistive material which has been applied to the external surface of a cylindrically shaped structure of drum 119. The two external opposite outer end regions 118A', 118B' of the drum 119 are shown to be silvered to provide in conductive contact with the resistive coating. A bodily uniform voltage gradient exists across the resistive material of drum 119 by electrically connecting the silvered region 118A' through line 130 to a source of regulated D.C. current and by connecting region 118B' through line 131 to ground.

The resistive drum 119 is shown rigidly mounted in axial alignment with thumbwheel 117 for rotation therewith. For this purpose thumbwheel 117 is shown having an annular wedge-like portion 117B over which is seated the end portion 118a of drum 119 (FIG. 8). To prevent relative rotational movement between drum 119 and thumbwheel 117, the edge of end portion 118a has a carved out segment 118c which is fitted about a notch 117c of wedge portion 117B. The end portion 125A of the lead screws 125 are reduced in diameter and are shown received and extending through mounting slots provided in thumbwheel 117. The wiper contact 133 is shown mounted adjacent the thumbwheel opposite the drum 119. Thus, as the thumbwheel is caused to rotate from detent to detent, the end portion 125A of each of the lead screws 125 is successively snapped into firm contact with contact 133. As stated, each lead screw 125 acts as a voltage bus bar and, as such, transmits the voltage level of its voltage tap 124 through wiper contact 133 and tuning voltage bus 17' to the proper of tuners 10, 15.

In order to control the mode of tuners 10, 15 as described with reference to the diagrammatic of the tuner control of FIG. 2 a cam structure 121 is shown axially aligned and rigidly mounted to shaft 105. As best shown in FIG. 9, cam structure 121 included an annular wedge-like portion 121' which supports the end portion 118b of drum 119. As shown, each of the lead screws 125 is received an extends through a suitable mounting slot provided in cam structure 121. Thus, rotation of thumbwheel 117 results in corresponding rotation of drum 119, cam structure 121 and lead screws 125.

As best shown in FIGS. 5 and 7, cam structure 121 includes a series of three axially spaced disc portions 121A, 121B and 121C, each having an edge raised cam lobe surface. As will be explained, the three disc portions serve to provide the switch control functions outlined above in the discussion of the cam discs C1, C2 and C3 of FIG. 2.

Three switches 140A, 140B and 140C respectively comprising the 2-position multi-pole switches as described with reference to FIG. 2 are shown mounted (FIG. 6) in side-by-side arrangement to control housing wall adjacent the cam structure 121. As shown, each of the switches has a cam follower 116 at all times in contact with a corresponding of the cam disc portions 121A, 121B and 121C.

In the typical application disclosed herein, tuner control 5 of FIGS. 3–10 is shown provided with a thumbwheel 117 having 13 detent positions corresponding to an equal number of channel selection settings. Each detent position presents a corresponding lead screw 125 into contact with wiper contact 133, thereby determining the level of voltage of tuning voltage bus 17'. The 13 detent positions are programmed to the tuners 10, 15 by switches 140A, 140B and 140C, as activated by the cam discs of cam structure 121 as follows:

1. Adjacent detent positions 1–3 correspond to three channels in the VHF low-band of channels 2–6. Rotation of thumbwheel 117 to each of these detent positions presents to wiper contact 133 a lead screw 125 having tap contact 124 which has been prepositioned along drum 119 so as to provide a voltage level in correspondence to one of the low-band VHF channels. During this time, cam discs 121A, 121B, 121C are caused to rotate to a position so that the raised cam lobe surface of disc 121A is in engagement with the cam follower of switch 140A thereby closing the switch. During this mode the raised cam lobe surfaces of discs 121B and 121C do not engage the cam followers of switches 140B and 140C thereby causing these switches to remain open.

2. Adjacent detent positions 4–7 correspond to 4 channels in the VHF high-band of channels 7–13. These detent positions each presents a lead screw into contact with wiper contact 133 providing a voltage level corresponding to one of the VHF high-band channels desired. During this mode, the cam disc structure is caused to rotate so that the raised cam lobe surface of cam disc portion 121B engages the cam follower of its corresponding switch 140B while the lobe surfaces of disc portions 121A and 121C assume a disengaged position relative to the cam followers of their corresponding switches 140A and 140C.

3. The remainder of the detent positions, 8–13, corresponds to 6 UHF channels. Each of these detent positions presents to wiper contact 133 a lead screw 125 having a tap arm 124 which has been prepositioned along drum 119 so as to provide a voltage in correspondence to one of the UHF channels. During this mode, cam structure 121 is caused to rotate so as to present the raised cam lobe surface 121C into engagement with the cam follower of switch 140C while lobe surfaces 121A and 121B assume a disengaged relationship relative to the cam followers of switches 140A and 140B.

This arrangement would permit the consumer to program his television set to all local channels as presently assigned to the United States. If the consumer moves from one locale to another, he need only to reposition the voltage taps 124 along drum 119 to provide a set of voltage levels in accordance with the channel frequencies of the new locale.

In should be noted that a relatively small variation in voltage in the UHF mode effects a relatively large range of frequency response in tuner 15, especially at the lower frequency UHF levels (see FIG. 15). For this reason, as well as for convenience of the viewer, it is highly desirable to provide preset fine tuning capability.

In the tuner control embodiment of FIGS. 3–10, preset fine tuning is achieved by providing means for rotating the lead screw structure that is at the selected channel setting (i.e. the lead screw which is in contact with contactor 133), thereby causing the carrier 126 and voltage tap 124 to move axially along drum 119. As stated, an axial voltage gradient exists across drum 119 so that axial movement of the voltage tap 124 produces a variation in the level of voltage transmitted to the corresponding lead screw 125.

To provide for rotation of the lead screws 125, each has a gear 131 (FIGS. 6 and 10) which is individually driven when at the selected channel setting by urging the fine tuning dial 127 inwardly of the tuner control housing, thereby forcing pinion 132, which is rigidly mounted to the drive shaft 128 of knob 127, into engagement with gear 131. Normally pinion 132 is maintained in disengaged relationship with the gears 131 by leaf spring 134 which is shown having one end fixed to the control housing wall and another end in journaled engagement with bearing surface 135 of shaft 128. To allow for inward movement of the fine tuning knob 127, the two opposite end portions of shaft 128 are received in elongated slots 129', 130' provided in the supporting panels 129, 130.

Axial movement of the lead screw structures 125 is effectively prevented by providing a lead screw end thrust support 141, which is secured adjacent cam structure 121 for rotation therewith The end thrust support 141 includes a disc-shaped portion 141A which seats the end region 125B of each of the lead screws 125 adjacent gears 131. The support 141 additionally has a hollow cup-shaped extension 141B providing a surface mounting for the disc-shaped wiper plates (FIG. 4).

In order to provide for AFC defeat capabilities an annular ring 142 is secured to the cup-shaped extension 141B which provides an annular array of equally spaced nodes 143. An AFC defeat switch 144 is rigidly mounted adjacent the nodes 143 of ring 142. As described with reference to the schematic switch DS-2 of FIG. 2 above, switch 144 functions to deactivate the AFC whenever the viewer is in the process of switching from channel to channel. As shown, switch 144 has a pair of arms 145, 146. Arm 146 is resilient and has a cammed end portion so that as the annular ring is caused to rotate during channel selection, the nodes 143 sequentially engage the cammed portion of arm 146 thereby forcing arm 146 into engagement with arm 145 to ground out the AFC. The spacing of the nodes is such that whenever the control is at a selected channel position the cammed portion of resilient arm 146 will be between adjacent nodes 143 thereby allowing arms 146, 145 to be separated whereby the AFC is activated.

Referring to FIG. 10, a similar fine tuning AFC defeat switch 147 (corresponding to defeat switch DS-1 of FIG. 2) is shown mounted adjacent the fine tuning knob 127 so that whenever knob 127 is in a depressed condition, a projection 148 of the biasing spring 134 will cause resilient arm 149 of switch 147 to contact arm 150 thereby grounding out the AFC.

To facilitate channel selection by the viewer, a readout drum 114 of transparent material is shown rigidly mounted between thumbwheel 117 and cam disc portion 121 (FIGS. 6 and 7). A series of channel indication numerals are printed onto the transparent readout drum 114 directly above each lead screw structure 125. As shown in FIG. 3, the printed numbers are visible to the viewer at each channel setting through an opening 143 provided in the tuner control housing wall. A pointer 138 is shown mounted to each of the carriers 126 to indicate to the viewer the channel at which the voltage tap arm 124 is set. To illuminate the readout drum 114, a series of holes 139 are provided in thumbwheel 117 so as to permit the entry of light from a source of light.

Referring now to FIGS. 11 to 17 there is shown a modified embodiment of a television tuner control 5. The principal difference between the modified embodiment and the embodiment previously described resides in the manner in which the mode of the tuners 10, 15 is controlled. To facilitate understanding of the modified embodiment, parts thereof corresponding to previously described parts of the embodiment of FIGS. 3 to 10 are identified by the same reference numerals.

Like the embodiment of FIGS. 3 to 10, the modified embodiment includes a resistive drum 119 having a plurality of lead screws 125 radially extending thereabout, each screw having a voltage tapping contactor 124 mounted for axial movement. The drum 119 is suitably fixed for detented rotation with and about the axis of shaft 105 that extends between opposite end walls 206, 207 of the control housing. Instead of a thumbwheel, the modified embodiment incorporates a large gear 217, fixed at the lower end region of shaft 105, which is driven by gear 218. Shaft 219 mounting gear 218 is axially shiftable inwardly from its normal position shown in FIG. 12 and is provided with gear teeth 220 engageable, when depressed, with fine tuning gears 131 (FIG. 11) for effecting fine tuning.

In order to control the mode of tuners 10, 15, the modified embodiment incorporates a switch structure 221 mounted on the frame that includes a set of three band switches, each switch having a top and bottom contact flanking a central leaf 222, 223, 224. With reference to FIGS. 1 and 12, leaf 222 functions in the manner of the switch arm of diagrammatic switch D, leaf 223 in the manner of the switch arm of switch B, and leaf 224 in the manner of the switch arm of switch C. Movement of leaves 222, 223 and 224 is controlled by a cam follower 225 that is slidable parallel to the axis of shaft 105 in the plane of the front face of the frame. The cam follower 225 has an integral lateral extension 226 provided with a set of three edge-slots 227, 228, 229, the centermost slot 228 being wider than the others. As illustrated, the free ends of the switch leaves 222, 223 and 224 respectively project into the slots 227, 228 and 229 so that vertical movement of the cam follower 225 effects a predetermined switch sequence for the set of band switches. In FIGS. 11 and 12 the cam follower is shown positioned so as to determine a low band VHF mode (i.e., the band switches operating as explained with reference to FIG. 1 when the switch arms of switches B, C and D are at position I). Further downward movement of the cam follower 225 results in the centermost leaf 223 engaging the lower contact of the corresponding switch and thereby determining a high band VHF mode. On the other hand, the UHF mode is effected upon upward movement of the cam follower 225 to a position where all the switch leaves 222, 223 and 224 respectively engage the top contacts. Suitable means (not shown) normally biases the cam follower 225 vertically upwardly so that the switches are normally set to determine a UHF mode.

The position of cam follower 225 is controlled through indexed rotation of cam wheel P about the axis of shaft 105. As will be described in greater detail below, cam wheel P includes a set of radially oriented cam elements, one cam element for each of the detent or channel selection settings, which, upon rotation of the cam wheel P, are located individually in position controlling relation to cam follower 225.

The previously described embodiment incorporates "fixed" band programing. That is, as shipped from the factory, certain detent positions are programed to channels 2 to 6 (low UHF band), other detent positions to channels 7 to 13 (high VHF band), and still others to channels 14 to 83 (UHF band). The modified embodiment allows the end user to program as many channels in any one band as he wishes within the total number of detent positions available. Moreover, it allows him to do so without the use of any tools.

To this end, in the modified embodiment each of the cam elements comprises a channel indicator tab 231. The tabs are divided into three sets: One set having channel indicating indicia corresponding to frequency channels included within the low VHF band, another set having indicia corresponding to frequency channels included within the high VHF band, and a third set having indicia corresponding to frequency channels included within the UHF band. The tabs 231 are all substantially identical in shape and include a generally rectangularly shaped indicator body portion 232 and a leg body portion 233 laterally extending therefrom. As best shown in FIGS. 13 and 14, the side walls 232A, 232B of the indicator body portion 232 and the side walls 233A, 233B of the leg body portion 233 of each tab 231 are angularly disposed so that when the tabs 231 are placed in side-by-side relation, they define an annular polygon-shaped array. With reference to FIGS. 15 to 17, a polygon-shaped support disk or wheel 234 is fixed to shaft 105 to rotate therewith and includes equally radially spaced tab mounting slots 235 of identical configuration, one for each of the detent or channel selection positions, for snugly receiving the leg body positions 233 of the tabs 231. Secure snap-fit engagement between the tabs 231 and mounting wheel 234 is achieved by provision of a recess 236 in the leg body portion 233 of each tab 231 that receives a conforming wall projection 237 of each slot 235. A disk-shaped retaining spring 238, which is held in place by a friction ring 239, securely holds the tabs 231 within the slots 235 and flexes sufficiently to allow the leading edge of the tab legs 233 to pass projections 237 upon insertion and removal of the tabs 231.

As best shown in FIG. 13, the leg body portion of each of the tabs 231 has a cam follower engaging region 240 having a thickness that is determined by the band that includes the channel indicated by the tab. Thus, in the illustrated embodiment, the cam follower-engaging region 240 of each of the tabs 231 having low VHF band channel number indications (channels 2 to 6) is of a thickness shown in solid outline in FIG. 13, whereas the region 240 of each of the tabs 231 having high VHF channel number indication is thicker (as illustrated by the bottom phantom line in FIG. 13) and the region 240 of each of the tabs 231 having UHF channel indications are thinner (as illustrated by the upper phantom line in FIG. 13).

As illustrated, the support wheel 234 is fixed on shaft 105 so that, as it rotates, the tabs 231 are individually and sequentially indexed into position controlling relationship with cam follower 225. That is, the cam follower-engaging region 240 of the set of tabs 231 having low VHF band channel indications and the region 240 of the set of tabs 231 having high VHF channel indications sequentially engage cam follower 225 and urge it vertically downwardly to its low and high VHF band determining positions respectively. As is apparent, there is no need for contact between the set of tabs having UHF indications with the cam follower 225 since, as explained above, the follower 225 is normally biased to its upper UHF band determining position.

As stated above, this arrangement enables the end user to program the tuner control in any manner he so desires and is limited only by the total number of channel selection positions available. For example, if as a consequence of territorial relocation, the end user wishes to re-program the tuner control, he need only interchange unwanted channel number tabs with tabs having the appropriate channel numbers for the new location. The axial position of the contacts 124 corresponding to the interchanged tab positions, of course, must then be changed (by means of fine tuning adjustment).

As is apparent to those skilled in the TV tuner art, the foregoing disclosure, together with the disclosures of the above-referenced Wittig Pat. No. 3,354,397, and Manicki Pat. No. 3,654,168 are incorporated in the two circuit embodiments shown in FIGS. 18 and 19.

Figure 18:
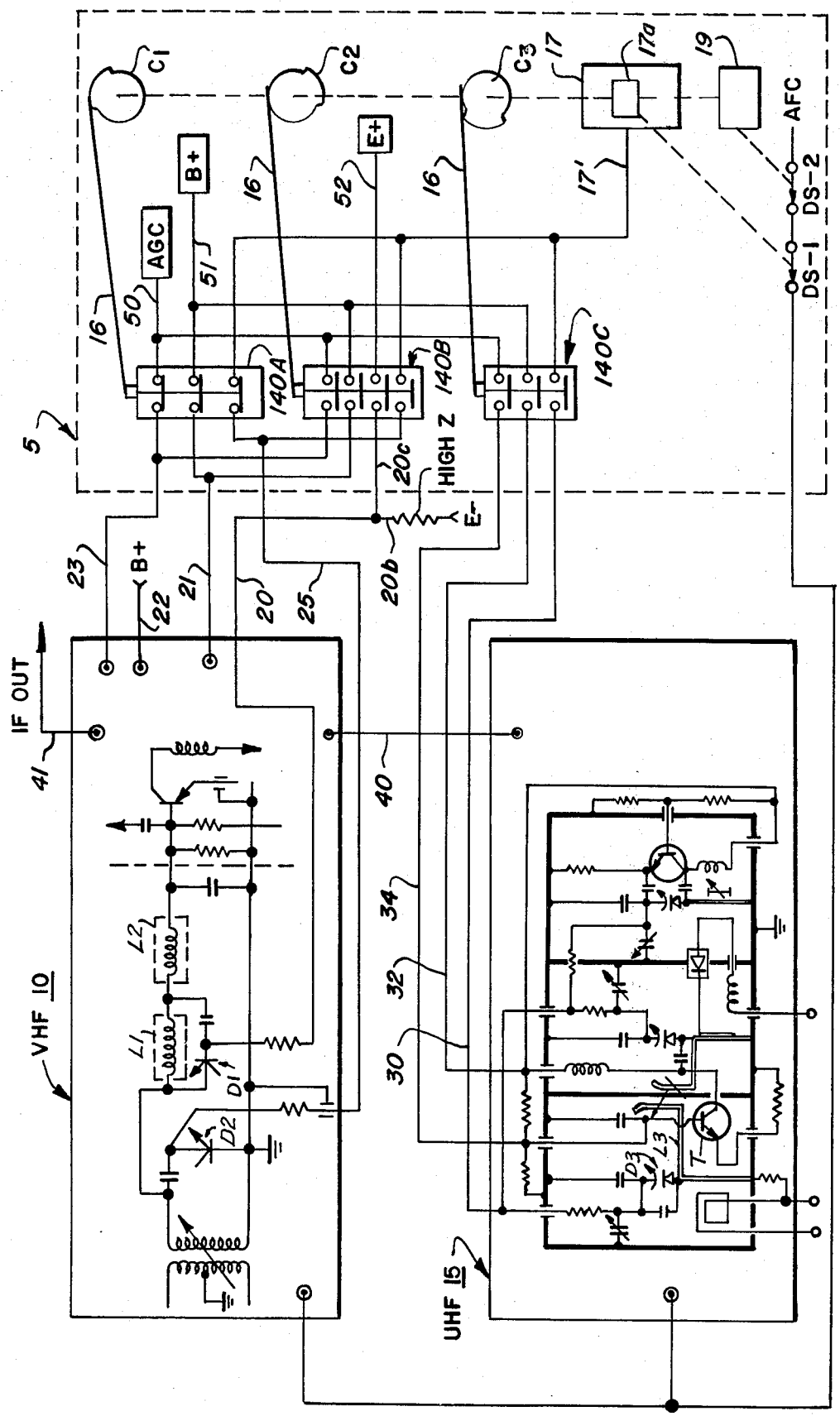
FIG. 18 is a schematic and functional diagram similar to FIG. 1 but with the VHF tuner circuitry of FIG. 5 of Wittig Pat. No. 3,354,397 illustrated and with a portion of the UHF tuner circuitry of FIG. 1 of Manicki Pat. No. 3,643,168 illustrated.
Figure 19:
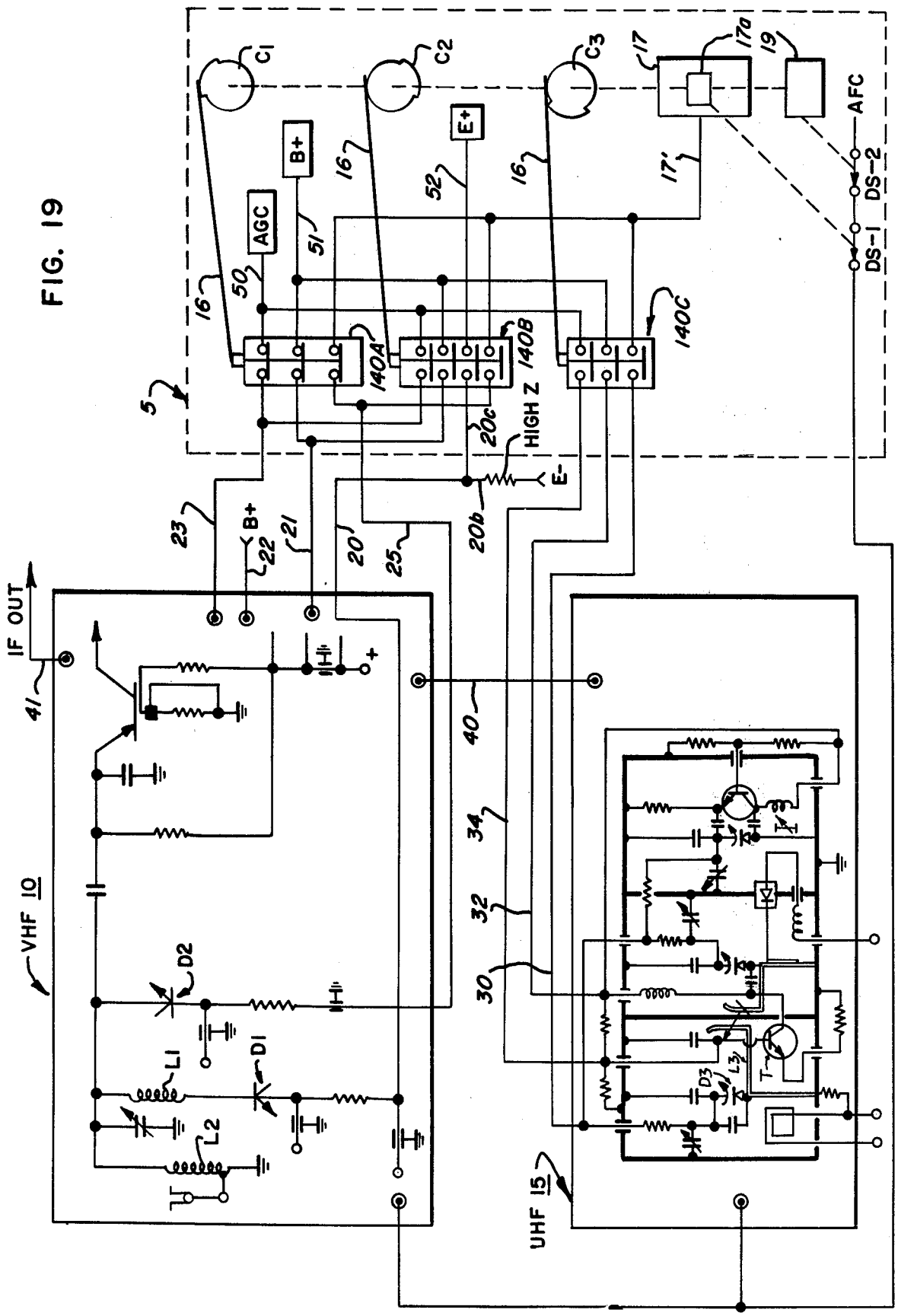
FIG. 19 is a schematic and functional diagram similar to FIG. 1 and explicitly showing the input portion of the VHF tuner of FIG. 8 of Wittig Pat. No. 3,354,397 and the UHF tuner circuitry of FIG. 1 of Manicki Pat. No. 3,643,168.

Tuner circuitry of FIG. 5 of Wittig Pat. No. 3,354,397 and of FIG. 1 of Manick Pat. No. 3,643,168, such circuitry being described in detail in the respective patents, are illustrated herein in FIG. 18 as constituting portions of the VHF and UHF tuners to clearly illustrate one specific aspect of the operation of the tuner control. In FIG. 18 the VHF tuner 10 is shown to include the input circuit, preceding the first amplifier stage, of FIG. 5 of Wittig Pat. No. 3,354,397 and described in detail therein. For present purposes it will be sufficient to note that this input circuit includes a tuned circuit between the secondary winding and the input of the amplifier of the radio frequency stage, the tuned circuit having band switching circuitry constituted by the series connected inductances $L_1$ and $L_2$, inductance $L_1$ of which is bridged by a control diode capacitor $D_1$. Bias voltage for diode-capacitor $D_1$ is controlled by means of switch 140B which acts to selectively apply voltage to bias the diode capacitor $D_1$ either in forward direction as a diode or in reverse direction as a capacitor. When switch 140B is closed (low-band VHF mode) the diode capacitor $D_1$ is reversely biased and acts as a capacitor. Both inductors $L_1$ and $L_2$ are then effective in the series circuit and tuning is established by variation of the voltage applied along line 25 on diode-capacitor $D_2$. When switch 140B is opened (high-band VHF mode) the diode capacitor $D_1$ is forward biased serving to short-circuit inductor $L_1$. Also in FIG. 18 the UHF tuner 15 is shown to include the UHF tuner of FIG. 1 of Manicki Pat. No. 3,643,168 wherein the preselector tuned circuit is shown to include a varactor diode $D_3$ and inductor $L_3$. The RF transistor is shown as T. Varactor diode $D_3$ is shown connected to receive tuning voltage from the control via line 30. With reference to FIG. 19, which is similar to FIG. 1 except that the VHF tuner 10 is shown to include the input circuitry shown in FIG. 8 of Wittig Pat. No. 3,354,397 and the UHF tuner includes the circuitry of FIG. 1 of Manicki Pat. No. 3,643,168. This UHF circuitry was described in connection with FIG. 18. In the VHF tuner 10 of FIG. 19, the previously described parallel inductances comprise inductors $L_1$ (corresponding to inductance coil 624 described in said Wittig patent) and $L_2$ (corresponding to coupling coil 606 described in said Wittig patent). Inductance $L_2$ can be seen to be the permanent inductance. The shunt high frequency inductance is inductance $L_1$. A diode-capacitor $D_1$ (corresponding to diode capacitor 622 described in said Wittig patent) is biased to present a high resistance or high capacitance value when the tuner 10 is to tune within the low frequency band, thereby effectively shunting out inductanc $L_1$. When tuner 10 is to tune within the high frequency band, diode-capacitor $D_1$ is oppositely biased so as to present a low resistance or small capacitance value whereby inductance $L_1$ acts in conjunction with the permanent inductance $L_2$. Tuning in either the high or low frequency bands is established by varying the voltage applied along line 25 on diode-capacitor $D_2$ (corresponding to diode capacitor 610 described in said Wittig Patent.

Thus, while preferred constructional features of the invention are embodied in the structure illustrated herein, it is to be understood that changes and variations may be made by those skilled in the art without departing from the spirit and scope of the appended claims.

What is claimed is:

1. A multi-channel tuner including a VHF section and a UHF section, said tuner comprising:
    a. first switch means for switching power to either said VHF or UHF section of said tuner;
    b. said VHF section having a high frequency band and a low frequency band and said VHF section including a VHF coil having a first portion which is short-circuited when said VHF section is operating in said high frequency band;
    c. short-circuit switch means connected in parallel with said first portion of said VHF coil for short-circuiting said first portion when said VHF section is operating in said high frequency band;
    d. second switch means coupled between a power source and said short-circuit switch means for connecting said power source to said short-circuit switch means thereby changing the polarity across the short-circuit switch means whereby the state of said short-circuit switch means is reversed;
    e. tuning capacitor means comprising a variable capacitance element in said VHF section and in said UHF section of said tuner;

f. a plurality of variable resistor means, coupled to said tuning capacitor means, for supplying a reverse bias to said tuning capacitor means; and g. third switch means for coupling only one of said plurality of variable resistor means to said variable capacitor means at a time, wherein said first, second and third switch means have a common operating shaft.

2. The multi-channel tuner as set forth in claim 1 wherein each variable resistor means corresponds to one channel of said tuner, said variable resistor means including selector means for varying the resistance of each of said variable capacitor means may be varied for each channel by varying the corresponding one of said variable resistor means.

3. A multi-channel tuner including a VHF section and a UHF section, said tuner comprising: first switch means for switching power to either said VHF or UHF section of said tuner; tuning capacitor means comprising first voltage variable diode capacitor means in said VHF section and second voltage variable diode capacitor means in said UHF section of said tuner; said VHF section having a high frequency band and a low frequency band and said VHF section including main inductance means coupled to said first voltage variable diode capacitor means to define a resonant frequency in one of said bands, additional inductance means, and voltage controllable switch means connected to said additional inductance means to operate in a first state to establish an operable circuit connection of said additional inductance means with said main inductance means to define a resonant frequency in the other of said bands and to operate in a second state to prevent said operable circuit connection of said additional inductance means with said main inductance means; said VHF section having means to apply a voltage of one polarity to said voltage controllable switch means to establish operation thereof in one of said states, second switch means coupled between a power source and said voltage controllable switch means for connecting said power source to said voltage controllable switch means thereby changing the polarity across the voltage controllable switch means whereby the state of said voltage controllable switch means is reversed; a plurality of variable resistor means, coupled to said tuning capacitor means, for supplying a reverse bias to said tuning capacitor means; and third switch means for coupling only one of said plurality of variable resistor means to said variable capacitor means at a time, wherein said first, second and third switch means have a common operating shaft.

* * * * *